US008715780B2

(12) United States Patent
Bruderer et al.

(10) Patent No.: US 8,715,780 B2
(45) Date of Patent: May 6, 2014

(54) METHOD AND DEVICE FOR PRODUCING A PLASTIC COATING

(75) Inventors: Alex Bruderer, Basel (CH); Jurgen Herbert, Lorrach (DE); Max Hunziker, Dudingen (CH); Michel Probst, Rixheim (FR)

(73) Assignee: Atotech Deutschland GmbH, Berlin (DE)

( * ) Notice: Subject to any disclaimer, the term of this patent is extended or adjusted under 35 U.S.C. 154(b) by 89 days.

(21) Appl. No.: 13/054,565

(22) PCT Filed: Feb. 19, 2010

(86) PCT No.: PCT/EP2010/001063
§ 371 (c)(1),
(2), (4) Date: Jan. 17, 2011

(87) PCT Pub. No.: WO2010/094500
PCT Pub. Date: Aug. 26, 2010

(65) Prior Publication Data
US 2011/0293823 A1   Dec. 1, 2011

(30) Foreign Application Priority Data

Feb. 19, 2009   (DE) .......................... 10 2009 009 650

(51) Int. Cl.
*B05D 1/26* (2006.01)
*B05D 3/00* (2006.01)
*B05C 19/04* (2006.01)

(52) U.S. Cl.
USPC ........... 427/195; 427/295; 427/360; 118/308; 134/21

(58) Field of Classification Search
USPC .............................. 427/195, 295, 360; 118/308
See application file for complete search history.

(56) References Cited

U.S. PATENT DOCUMENTS

| 3,484,484 | A | | 12/1969 | Bullough |
| 3,486,484 | A | | 12/1969 | Bullough |
| 3,503,777 | A | * | 3/1970 | Kappas .......................... 428/96 |
| 3,947,108 | A | * | 3/1976 | Thettu et al. .................. 399/347 |
| 4,113,576 | A | * | 9/1978 | Hutkin .......................... 428/626 |
| 6,136,732 | A | * | 10/2000 | Patel ............................. 442/149 |
| 6,254,712 | B1 | * | 7/2001 | Enlow et al. ............. 156/244.11 |
| 2002/0114884 | A1 | * | 8/2002 | Friedersdorf et al. ........ 427/195 |
| 2007/0093620 | A1 | | 4/2007 | Rickert et al. |
| 2009/0285976 | A1 | * | 11/2009 | Lochtman et al. .............. 427/64 |

FOREIGN PATENT DOCUMENTS

| DE | 1577653 | 4/1970 |
| DE | 2543197 | 4/1977 |
| DE | 69032225 | 11/1998 |

(Continued)

OTHER PUBLICATIONS

International Preliminary Report on Patentability (English translation) as cited in PCT/EP2010/001063.

*Primary Examiner* — Frederick Parker
(74) *Attorney, Agent, or Firm* — Workman Nydegger

(57) ABSTRACT

Method for producing a plastic layer having a layer thickness of less than 200 μm on an upper side of a substrate includes the following steps:
  applying plastic powder to the substrate upper side by means of a powder scattering device,
  then cleaning the substrate underside,
  then melting the applied plastic powder in a furnace, as a result of which the plastic layer is formed on the substrate, and
  cooling the substrate, wherein the substrate is transported continuously from method step to method step.

22 Claims, 2 Drawing Sheets

(56) References Cited

FOREIGN PATENT DOCUMENTS

| DE | 10313555 | 10/2004 |
| EP | 0 486 569 | 5/1992 |
| EP | 0486559 | 3/1996 |
| WO | WO 00/10802 | 3/2000 |

* cited by examiner

METHOD AND DEVICE FOR PRODUCING A PLASTIC COATING

BACKGROUND

The present invention relates to a method for producing uniform and thin plastic layers on a substrate, such as a copper foil for example, using plastic powder as the coating material and to an apparatus for carrying out the method. In particular, base material for printed circuits is intended to be produced therewith.

In order to produce printed circuit boards, use is often made of a laminate which comprises a metal layer, e.g. a copper layer, and an electrically insulating plastic layer. The plastic layer is usually a dielectric, such as an epoxy resin for example. Conventional production processes for such laminates comprise firstly an application of the resin in liquid form to the copper layer using solvents. Drying then takes place in a furnace, whereby the solvent evaporates. This can lead to a number of problems, including increased porosity, pinholes, solvent inclusions and the like in the resulting layer of epoxy resin. Furthermore, the use of solvents is disadvantageous from the point of view of protecting the environment.

DE 103 13 555 A1 discloses a method for producing a coating layer by applying a coating in powder form, which is melted and then hardened. Laid-open specification DE 1 577 653 describes an apparatus for applying a coating in powder form using a rotatable measuring roller, a scraper for releasing the powder from the grooves of the roller, and a vibrating screen for comminuting powder clumps and distributing the powder removed from the roller. DE 25 43 197 C2 describes a powder scattering machine which comprises a rotating powder-carrying roller with a brush, wherein the brush is driven to perform a back and forth movement parallel to the axis of rotation of the powder-carrying roller.

In these methods, however, the problem exists that the rear side of the substrate (the side opposite the powder-coated side) may become contaminated by powder particles. This is particularly disadvantageous when producing base material for printed circuit boards since, during a subsequent etching step to produce conductor tracks, areas of the substrate may be covered by molten powder and thus are not etched, which leads to waste.

BRIEF SUMMARY

The object of the invention is accordingly to provide an improved method for producing plastic layers on substrates, and also an improved apparatus for carrying out such a method.

In particular, the intention is to produce on one side of a substrate a plastic layer which is as far as possible pore-free and has a layer thickness of less than 200 µm and a small layer thickness tolerance. The intention is for continuous production in a run-through system to be possible.

The intention is also for layer thicknesses from about 200 µm down to 10 µm to be able to be achieved on a substrate using the method and the apparatus. The production method should inter alia be cost-effective and environmentally friendly. There should be no need for solvents.

This object is achieved by the features of the independent claims. The dependent claims describe embodiments of the invention.

According to one aspect of the present invention, there is provided a method for producing a plastic layer having a layer thickness of less than 200 µm on an upper side of a substrate. The method according to the invention comprises applying plastic powder to the substrate upper side by means of a powder scattering device, then cleaning the substrate underside, then melting the applied plastic powder in a furnace, as a result of which the plastic layer is formed on the substrate, and cooling the substrate, wherein the substrate is transported continuously from method step to method step.

In this way, the production process can take place without using solvents. The cleaning of the substrate underside can furthermore ensure that no areas which are covered by a plastic layer are formed on the underside of the substrate during melting. The plastic layer can solidify during cooling of the substrate. This can allow the plastic-coated substrate to be rolled up and transported or further processed.

According to one embodiment of the invention, the powder scattering device may comprise a metering roller, wherein the plastic powder is metered via the metering roller. The plastic granular material or plastic powder can thus be applied very evenly to the substrate, and a uniform layer can be produced.

The plastic powder may be brushed out from the metering roller and, from the brushing-out location, drops firstly onto at least one screen before it drops from there onto the substrate. The distance of the screen underside from the substrate may be less than 100 mm, preferably less than 50 mm or particularly preferably 20 mm or 15 mm. As a result, a uniform distribution of the powder on the substrate can be ensured.

Furthermore, the D50 value of the plastic powder, which describes the particle size of the plastic particles to be applied, may be set to a predetermined value range before the plastic powder is applied. This may take place for example by comminution, a grinding process or a screening process. The particle size can thus be optimised for use with the powder scattering device, as a result of which an even application of the powder is achieved.

Preferably, the cleaning of the substrate underside takes place by means of a cleaning device which comprises at least one adhesive roller. By using an adhesive roller, it is possible to reliably remove the powder particles adhering to the substrate underside.

In this case, the cleaning device may comprise a motor drive which drives the adhesive roller. The adhesive roller therefore need not be driven by the substrate. It is thus possible to avoid vibrations of the substrate, which have an adverse effect on uniform distribution of the plastic powder.

The cleaning may take place by means of at least two cleaning steps, wherein a first cleaning step comprises a suction and/or a cleaning by means of a brush and a second cleaning step comprises a cleaning by means of a device comprising an adhesive roller. As a result, a thorough cleaning can be ensured. The first cleaning step may for example be configured in such a way that it removes more than 80% of the particles located on the substrate underside. The complete particle removal can thus be improved, and a rapid saturation of the adhesive roller with accumulated particles can be avoided.

The first cleaning step may for example take place by means of a brush composed of animal or artificial feathers or plastic fibres.

The particle size distribution can be set before applying the plastic powder so that it is suitable for the layer to be produced. The plastic powder may have a particle size distribution with a D50 value in a range from 10 to 100 µm, preferably from 20 to 80 µm or particularly preferably from 30 to 70 µm.

Preferably, the application of the plastic powder takes place evenly, so that a plastic layer with a uniform layer thickness distribution is obtained.

The plastic layer can serve as a base material for producing a printed circuit board. In particular, the plastic layer produced can serve as a dielectric of a printed circuit board or conductor foil. The substrate may be for example a foil, board or strip. The substrate may be made from insulating or conductive material, preferably from metal such as copper, aluminium or steel. If the layer is used as a dielectric of a printed circuit board/conductor foil, it is advantageous if the plastic layer has so-called B-stage properties after the production process according to the invention, that is to say is not yet fully chemically crosslinked.

According to another aspect of the present invention, there is provided an apparatus for producing a plastic layer having a layer thickness of less than 200 μm on an upper side of a substrate. The apparatus comprises a powder scattering device for applying plastic powder to the upper side of the substrate, a cleaning device for cleaning the substrate underside, a furnace for melting the plastic powder applied to the substrate, a cooling zone, and a transport device which transports the substrate continuously through the apparatus.

Similar advantages can be achieved with such an apparatus as with the method according to the invention. In particular, the use of solvents and the formation of plastic-coated areas on the substrate underside are avoided.

According to one embodiment of the apparatus according to the invention, the powder scattering device may comprise a metering roller as the metering device for the plastic powder. Furthermore, the powder scattering device may comprise a brush for brushing the plastic powder out of the metering roller. At least one screen may also be arranged between a location at which the plastic powder is brushed out (brushing-out location) and the substrate.

The powder scattering device may comprise at least one storage container, a metering device and a distributor device.

By way of example, the powder scattering device may comprise a distributor device, wherein the distance between a lower edge of the distributor device and the substrate is less than 100 mm, preferably less than 50 mm or particularly preferably 20 mm or 15 mm. A suitable distributor device is for example at least one screen.

Furthermore, the cleaning device may comprise at least one adhesive roller. The cleaning device may comprise a drive for driving the adhesive roller, so that the adhesive roller need not be driven via the substrate.

It is advantageous if the apparatus comprises a further cleaning device which is arranged upstream of the aforementioned cleaning device. The upstream further cleaning device may comprise a suction device and/or a brush.

The brush of the further cleaning device may comprise animal or artificial feathers or plastic fibres and combinations thereof as cleaning elements. These are able to provide effective cleaning of the substrate underside.

The furnace may comprise heating elements which are arranged opposite the substrate on the side comprising the scattered powder.

Another aspect of the present invention relates to the use of the apparatus described above or of one of the embodiments thereof for producing copper foil coated with plastic on one side as a base material for producing printed circuit boards or conductor foils.

The copper foil coated with plastic on one side which is produced by using the apparatus may have a plastic layer with low porosity and with a uniform layer thickness. The production can also take place without the use of solvents. Furthermore, the use of the apparatus can ensure that the underside of the copper foil remains free of plastic.

By virtue of the apparatus and the method according to the various embodiments, layers can be deposited with layer thicknesses which, over the entire usable surface area, have deviations from the nominal layer thickness or from the average layer thickness determined by averaging over a larger substrate area which are less than ±30%, preferably less than ±20% and particularly preferably less than ±10%. This applies even to nominal layer thicknesses of less than 50 μm. The layer thickness is determined by a weight measurement of the plastic layer over a surface area of less than 8 cm$^2$. If the setting of particle sizes or of the particle size distribution is provided for in the method or the apparatus, layers with a particularly uniform layer thickness can be achieved.

The features of the above-described aspects and embodiments of the invention can be combined.

BRIEF DESCRIPTION OF THE DRAWINGS

The invention will be explained below with reference to the appended drawings. In the drawings, identical references denote identical elements.

DETAILED DESCRIPTION

The figures should be understood only as schematic diagrams which serve to illustrate the invention. The elements shown in the figures are accordingly not shown to scale relative to one another.

In one embodiment of the method according to the invention, a plastic layer is produced on a substrate in that plastic powder is scattered evenly on the upper side of the substrate by means of a suitable system, thereafter the underside of the substrate is cleaned, then the applied granular material/powder is melted and then transformed into the solid aggregate state by cooling, so that a homogeneous plastic layer is formed. Before, between and after these process steps, further process steps may take place, such as e.g. comminution processes, cleaning steps, lamination processes or cutting processes. In this way, the entire production process takes place without the use of solvents.

Plastic powder which can be used to produce the plastic layer includes both finer plastic powder and also coarser plastic granular material.

Using this method, other materials can also optionally be processed to form thin layers of uniform thickness. The substrate is in this case transported continuously from method stage to method stage.

The material of the plastic layer may be e.g. polyester resin. By means of a suitable application device, plastic granular material or plastic powder can be applied very evenly to the substrate and thus a uniform layer can be produced. A powder scattering device is proposed. This consists essentially of a dispensing device, a metering device and a distributor device.

Figure 1:
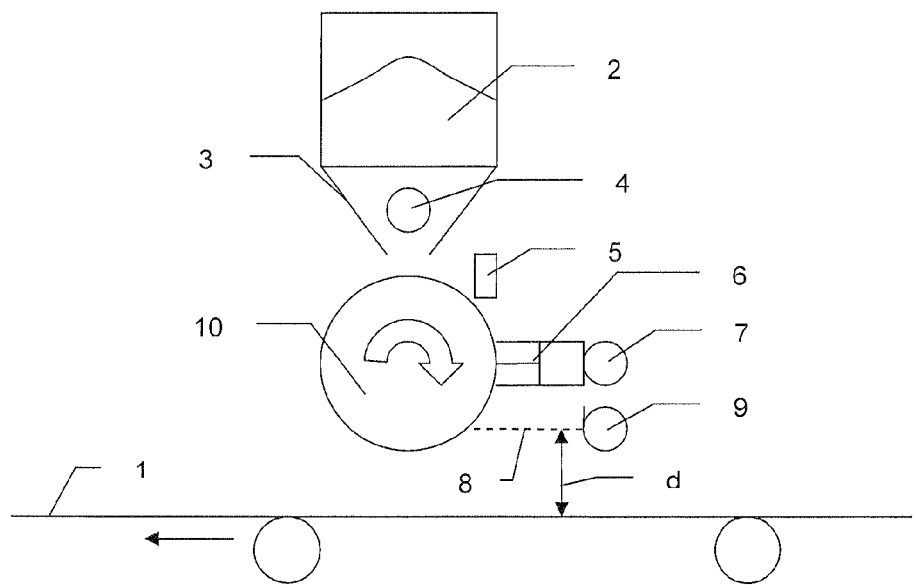
FIG. 1 schematically shows a sectional view of a powder scattering device which is used in one embodiment of the apparatus according to the invention.

As shown in FIG. 1, a rotating roller 10 is proposed as the metering device, or alternatively a revolving belt which receives the powder coming from the dispensing device 3. After a rotation of the roller 10, the received powder particles reach the location where they are removed from the metering device. From there, the powder drops in the desired quantity and with an already relatively uniform distribution onto the distributor device 8 located therebelow. From there, the powder drops in the desired uniform distribution onto the substrate 1. The dispensing device 3, e.g. a trough, delivers a constant mass flow of powder to the metering device. The metering device, e.g. a needle roller, serves to produce a mass flow of powder which is temporally and physically as uniform as possible. The distributor device, e.g. a screen 8, serves to improve the distribution.

The dispensing device 3 may be provided with a device which ensures that the powder exits from the dispensing device without interruptions, e.g. a vibrating device or rotating blades within the dispensing device in the vicinity of the powder outlet. A supply of gas, e.g. nitrogen or air, into the dispensing device 3 may also be provided, in order to achieve a fluidisation of the powder. The dispensing device 3 may have an opening for the powder outlet which extends at least over the working width. The working width is the desired application width on the substrate.

In order to receive the powder from the dispensing device 3 on the roller 10, the latter has a structured surface by using delimiting elements such as e.g. needles, pins, bumps or walls, so that the roller surface has depressions relative to the outer diameter. By means of a device, e.g. a scraper, the depressions on the roller are filled with powder to a uniform height. In order to achieve a uniform layer thickness of the finished plastic layer, this filling level is the same along the length of the roller.

Figure 2:
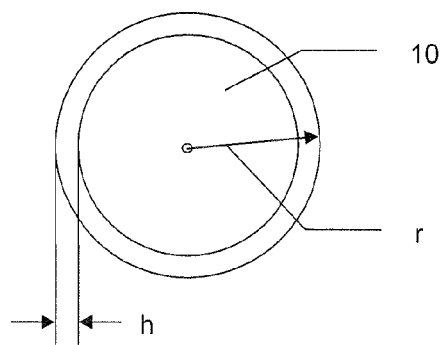
FIG. 2 shows an enlarged view of a metering roller of FIG. 1, wherein the height of delimiting elements which provide depressions in the metering roller is illustrated.

The height h of the depressions is illustrated schematically in FIG. 2. Here, r denotes the outer radius of the roller 10. The depressions should not exceed a value of 5 mm, preferably 2.0 mm, particularly preferably 1.5 mm, relative to the outer diameter of the roller. The depressions should have a depth of at least 0.3 mm, preferably 0.5 mm, particularly preferably 0.8 mm, relative to the outer radius. By way of example, the depressions may have a depth in a range from 0.3 to 5 mm, preferably 0.5 to 2 mm or 0.8 to 1.5 mm, relative to the outer radius.

The distances between the delimiting elements can be selected to be so narrow that the applied powder remains stuck in the depressions before it is removed therefrom in a subsequent method step, e.g. by means of brushes. The material of the roller on its surface may be made from plastic or metal. The material of the delimiting elements may be made from plastic or metal, preferably from metal.

The powder remains in the depressions of the roller surface until it is at least partially removed therefrom after a rotation of the roller. This may take place by means of brushes.

For example, a rotating brush is possible. The direction of rotation of the brush is preferably counter to the direction of rotation of the roller. Another possible arrangement is a brush which extends parallel to the axis of the roller and is moved in an oscillating fashion in the axial direction.

The brush hairs may be made from plastic, ceramic or preferably from metal. The brush hairs may be conductive. The brush may be subjected to an electric potential; it may also be earthed. A flow of ionised gas, e.g. ionised air, may be applied to the brush in order to prevent adhesion of the plastic particles.

The brushing-out location, that is to say the location at which the brush hairs make contact with the roller surface, may lie approximately (+/−30% of the roller diameter) at the same height as the geometric roller axis.

The parallelism between brush and roller and the depth of penetration of the brush hairs into the depressions should be as even as possible along the entire length of the roller loaded with powder. The deviation should be no more than 0.5 mm, preferably 0.1 mm, particularly preferably 0.05 mm, in order to achieve a uniform application of the powder to the substrate.

In order to improve the uniformity of the powder layer scattered onto the substrate, the powder after being brushed out may drop firstly onto a screen-type device. This device is located below the brushing-out location. It may be e.g. a mesh screen or a perforated plate. This screen-type device may be moved via a drive. This movement is preferably plane-parallel to the substrate. It may take place in a linearly oscillating fashion transverse to the transport direction of the substrate. It may also be moved in a plane parallel to the substrate, e.g. in a circular fashion.

The drive of the screen may be independent. The brush and screen may also use a common drive. The screen-type device may consist of one ply. It may also consist of a plurality of plies arranged one above the other.

The movement frequency is for example at least 10 Hz, preferably at least 100 Hz, particularly preferably at least 200 Hz. The maximum movement frequency may be more than 100,000 Hz. Suitable drives for the screen movement may be inter alia electric and pneumatic motors or ultrasound generators. There may be located below the screen-type device one or more further screen-type devices of the type described above. They may be provided with a separate movement drive with separate movement parameters or also with a common movement drive.

The clear width d between the lowermost screen-type device and the substrate should be as a maximum 50 mm, preferably 25 mm, particularly preferably 20 mm and more particularly preferably 15 mm. It should be as a minimum 1 mm, preferably 2 mm, particularly preferably 3 mm, more particularly preferably 5 mm.

The mesh width of the lowermost screen-type device may be 100 μm to 1000 μm, preferably 200 μm to 800 μm. Screen-type devices arranged thereabove may be structured more coarsely with hole diameters of 1 mm to 10 mm, preferably 2 mm to 6 mm.

In order to avoid the situation whereby particles remain stuck in one of the screens and thus change the clear width of the screens, at least one screen may be provided with a device which, by means of mechanical impacts, generates such vibrations on the screen that stuck particles drop down. Such a device may be driven via the movement of the screen. This device may use the mass inertia of a body moving therewith. This body may hit an end position at each change of direction of the moving screen and thus generate the impacts on the screen.

The substrate is moved relative to the application or powder scattering device so quickly that the desired layer thickness is achieved. However, given a substantially constant speed of the substrate, the speed of the dispensing device, i.e. for example the rotational speed of the roller, may also be varied or adjusted.

In order to achieve sufficient uniformity of the scattered layer, it may be helpful to guide the substrate in a planar and horizontal manner. In particular, this may be helpful below the application device. This guidance may be achieved for example by means of a table or at least two rollers below the substrate.

In general, it may be advantageous to guide the substrate in a horizontal and planar manner between the scattering of the powder and the cooling of the layer. The rise at bumps should be at most 10%, preferably at most 7%, particularly preferably at most 5%.

Furthermore, it may be helpful to configure this guide in such a way that as little movements and vibrations as possible from other devices such as the roller drive, the brush device with its drive or the screen-type device with its drive are picked up and passed on to the substrate. For example, the above guide may be mechanically decoupled from the application device or the guide may be configured with a weight of more than 50 kg. A sufficiently planar guidance of the substrate can be achieved by arranging the guide in such a way that the substrate is guided out of the plane that would be described without the guide. For example, a guide may be arranged somewhat above the run-through plane that would be taken by the substrate without the guide, so that the substrate is then pressed onto the guide in a planar manner.

To prepare for the powder application, it may be helpful to set the particle size of the powder particles to certain values or value ranges prior to application by means of the system described above. For instance the D50 value, that is to say the particle size value at which 50% of the mass has a smaller diameter and 50% has a larger diameter than this value, should be less than 100 μm, preferably less than 80 μm, particularly preferably less than 70 μm. The D50 value should furthermore be greater than 10 μm, preferably greater than 20 μm, particularly preferably greater than 30 μm.

In order to achieve these values, the plastic powder may during production be comminuted, e.g. in a grinding process, and/or sifted, e.g. in a screening process. In order to obtain a sufficient homogeneity of the ingredients of the plastic powder, it is advantageous to thoroughly mix the starting materials. The thorough mixing may take place for example in a stirred vessel or in an extruder or the like.

Figure 4:
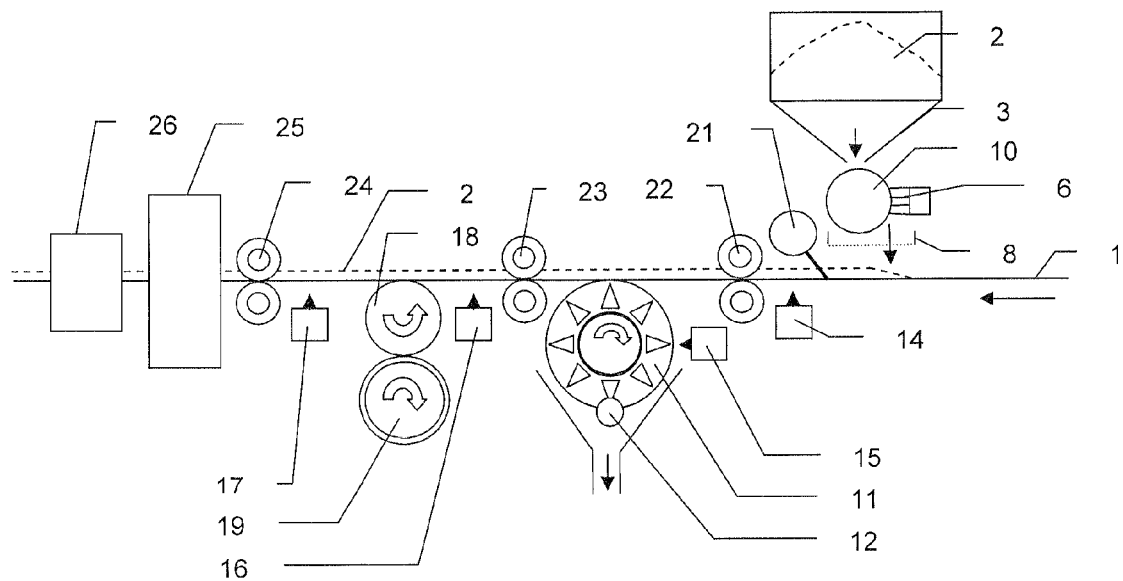
FIG. 4 schematically shows a sectional view of one embodiment of the apparatus according to the invention, wherein the embodiment comprises the powder scattering device shown in FIG. 1.

After the powder application, it may be necessary to clean the coated substrate. FIG. 4 shows an embodiment of the apparatus according to the invention which provides such a cleaning.

The cleaning of the underside may be important inter alia because as a result no insulating and thus non-etchable points are located thereon when the film is used as a printed circuit. During a subsequent etching process, there should be no non-etchable points, since these would lead to electrical malfunctions of the printed circuit.

It has been found that the cleaning system for the cleaning step of the foil manufacturing process ought to satisfy particular requirements.

For instance, it is advantageous if an extremely good cleaning performance is achieved, since powder particles adhering to the underside are not acceptable during the subsequent melting process. Furthermore, it is desirable that the cleaning process does not impair the desired uniformity of the powder application. For example, the foil should not be caused to vibrate undesirably. Reliable, continuous operation of the system should also be possible. In the present embodiment of the invention shown in FIG. 4, this is achieved by an at least two-stage cleaning system with two different cleaning devices. However, it should be clear that the apparatus according to the invention may also be provided with just one cleaning device.

To this end, there is firstly proposed as an essential part of the cleaning a cleaning device which comprises at least one adhesive roller. A device comprising a rotating adhesive roller may be used. This roller can bear with its cylindrical surface against the substrate rear side and can remove and pick up undesired particles from the substrate rear side by means of its adhesive-coated surface.

However, use may also be made of a rotating transfer roller which makes contact with the substrate rear side. The transfer roller then picks up the particles from the substrate rear side and, after a rotation of the transfer roller, the adhesive roller bearing against said transfer roller picks up the particles from the latter and holds them on its adhesive surface. The advantage of the last variant lies in the fact that no adhesive particles remain stuck on the substrate rear side. Furthermore, the roller does not adhere to the substrate rear side, so that any vibrations that may occur are avoided. The surface of the transfer roller may be made from plastic. The adhesive force of the surface of the transfer roller relative to the particles should be greater than that of the substrate rear side but lower than that of the surface of the adhesive roller.

In both variants, it is advantageous if the foil is pressed at its edges onto the roller surface, in order to ensure a sufficient planarity of the foil and removal of particles across the entire foil width. Furthermore, it may be advantageous if the adhesive roller device has a motor drive, so that the rollers are not driven via the foil. The drive may take place in such a way that the circumferential speed of the roller which makes contact with the substrate is substantially equal (+/−20%) to the transport speed of the substrate. As a result, it is possible to avoid undesirable vibrations which may result in an unacceptable non-uniform particle distribution.

In order to achieve sufficient contact between the roller which makes contact with the substrate and the substrate, the substrate may be pushed upwards out of its transport path by the contacting roller. There may be provided before and after the adhesive roller device a device, e.g. an air ionisation, for neutralising the static charge of the substrate rear side and of the particles. This makes it easier to remove the particles from the foil and prevents any reattachment. It is also possible to use more than one adhesive roller device arranged one behind the other, which increases the likelihood of complete particle removal.

In order to avoid an excessively quick saturation of the adhesive roller with accumulated particles, a further cleaning device for the substrate rear side may be provided, in order to remove most of the adhering particles already before the adhesive roller device. This may be for example a suction device. Suction may preferably be applied to the edges, since a higher particle density may exist here. It may also be helpful to apply suction to the edges on the substrate upper side, e.g. immediately after or even during the powder application. An accumulation of particles on the substrate underside can thus be reduced.

The further cleaning device may also comprise at least one brush device such as a rotating brush roller or a revolving brush belt acting in the same way. This brush roller is able to remove the particles from the substrate rear side and to discharge them again from the brush surface, e.g. by means of a suction device, after rotation of the roller. The brush roller thus cleans the substrate rear side and is itself cleaned in turn. It may be provided with hairs, cloths, textiles, plastic fibres and the like. Preferably, use is made of soft bird features, e.g. from ostriches and emus. The particles can be removed from the brush, e.g. by the particles being knocked off at a knock-off device such as a bar or a wall. This may usefully be combined with a suction device. The suction device may be located below the brush roller. In addition, the removal of the particles from the brush may be assisted by using ionised gas which is supplied to the brush. The brush surface may also be brought into contact with an electrically charged or earthed surface in order to eliminate static charges which lead to the adhesion of particles on the brush surface.

In order not to transfer any undesirable vibrations to the substrate, the relative speed between the substrate and the roller surface should not exceed 5 m/s. The substrate should not "compress" the roller from its maximum diameter by more than 100 mm. In a range of less than 1 m before and after the contact point, the substrate may be supported, e.g. by rollers, which may also be driven by a motor. To ensure sufficient planarity, the edges may be held in the plane by holding-down devices, e.g. rollers or wheels. The wheels may be mounted in terms of their orientation in such a way that they point obliquely outwards, so as thus to make the foil taut.

After the powder application and the cleaning, the melting of the plastic powder scattered on the substrate takes place. In order to achieve a uniform melting and thus also a uniform layer thickness during the production of plastic layers, e.g. to produce a plastic layer on a metal foil such as a copper foil, it may be helpful to use a radiation furnace which has one or more heating areas, through which the substrate runs in succession.

Use may be made for example of a furnace which operates in the NIR range (radiation wavelength from 0.5 to 3 µm). In order to achieve the desired material properties of the product, a treatment time of 60 seconds, preferably 45 seconds, particularly preferably 30 seconds, should not be exceeded. The minimum treatment time is 1 second, preferably 3 seconds, particularly preferably 5 seconds.

It is also possible for two process steps to take place in the furnace. Firstly the melting of the applied powder layer, and then the chemical crosslinking of the plastic. Both processes may take place in one and the same furnace. It may be that the chemical crosslinking during this process step does not take place completely, but rather only so far as the degree of crosslinking is required. It may be for example between 3% and 80% of the maximum possible crosslinking. The degree of crosslinking may be adjusted via the residence time in the furnace. The degree of crosslinking may also be adjusted via the supplied energy of the furnace. The adjustment of the required energy of the furnace may take place via the temperature of the surface of the plastic layer.

The heating elements are preferably arranged above the substrate, that is to say above the coated side of the substrate. The heating elements in the furnace may be split into segments, through which the goods pass in succession. A segment may be assigned at least one sensor for temperature detection. The furnace may be operated in such a way that the temperature on the surface of the goods is different from segment to segment. In particular, the temperature below the first segment may be lower than below a subsequent segment.

After the melting, the cooling takes place, e.g. by means of fluid nozzles such as air nozzles or a sufficiently dimensioned cooling path, so that the consistency of the plastic layer is such that the substrate with the plastic layer can be rolled up or stacked without any sticking occurring. Cooling to a maximum temperature of 50° C. should take place within 10 seconds, preferably 5 seconds, after leaving the furnace. The product then has the desired properties. By virtue of the production method described above, the plastic layer produced is also free of pores.

FIG. 1 schematically shows the application device as can be used to produce a plastic layer on one side of a copper foil.

The dispensing container 3 is continuously or discontinuously filled with the plastic powder 2. A loosening device 4 ensures that the powder continuously runs out of the dispensing container 3. From the dispensing container 3, the powder runs onto the roller 10 and fills the roller depressions between the delimiting elements, e.g. needles. The uniform filling level of the roller depressions is set via a scraper 5. The scraper 5 may be set in such a way that no contact is made with the surface of the roller 10, in order to avoid any abrasion of roller material, e.g. metal shavings.

Once the powder located on the roller has been further transported by the rotation of the roller, it is brushed out of the roller depressions by the brush 6 and drops onto the screen-type device 8 located therebelow. The drive of the screen-type device 9 may be separate from or in common with the drive 7 for the brush 6. From the screen-type device 8, the powder is distributed uniformly onto the copper foil 1 transported below the application device. The distance d between the screen lower edge and the surface of the copper foil 1 is no more than 50 mm. The transport direction of the copper foil 1 is denoted by the arrow. However, the transport may also run in the opposite direction.

In order to achieve a high degree of precision of the geometric relationships to one another, the roller 10, the scraper 5 and the guide of the brush 6 may be attached to a common frame.

FIG. 2 shows the height of the delimiting elements which define the depressions of the roller relative to its outer radius.

Figure 3:
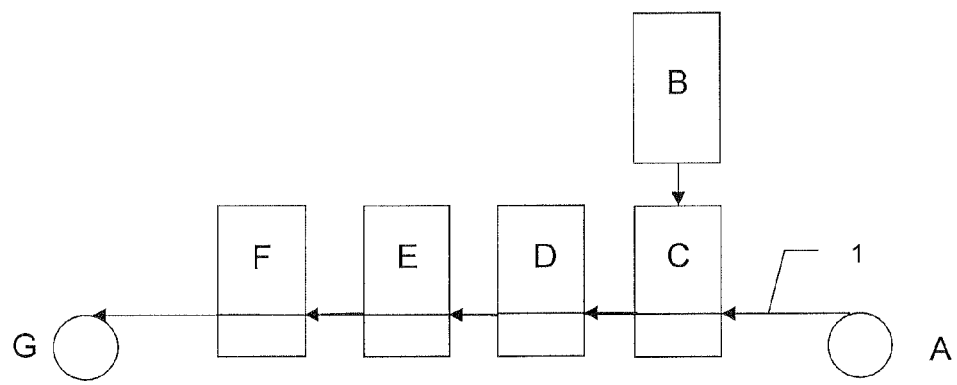
FIG. 3 shows a process sequence according to one embodiment of the method according to the invention.

FIG. 3 shows the process sequence of the layer application. The substrate 1 is transported from the unwinding station A to the winding station G. In process stage B, the plastic powder is produced with regard to particle size distribution and composition. The powder application to the substrate 1 then takes place in process stage C. In process stage D, a cleaning of the substrate rear side and/or also of the substrate edges may take place. The powder is then melted in a furnace in stage E and then is cooled in the cooling zone F, so that the foil coating having the desired properties is formed. To finish, the coated substrate is rolled up in the winding station G for further processing. The method may be carried out for example using the powder scattering device described with reference to FIG. 1 and/or the apparatus described with reference to FIG. 4.

FIG. 4 schematically shows an embodiment of the apparatus according to the invention with a cleaning system. Firstly the plastic powder 2 is scattered onto the substrate 1, e.g. a foil. The powder comes from the dispensing device 3 and is metered via a roller 10 with a brush 6, wherein a screen 8 located below the brushing-out location ensures sufficient uniformity of the powder application. For scattering the powder, the apparatus may comprise the powder scattering device shown in FIG. 1.

A cleaning of the substrate edge on its upper side may then take place, e.g. by means of an edge suction 21. Thereafter, a neutralisation of the static charge of the particles on the substrate underside may take place by means of a neutralisation device 14 for electrostatic charges, e.g. an air ionisation device. This is followed by a cleaning step using a brush roller 11 provided with ostrich/emu feathers which, as the brush rotates, come into contact with the substrate rear side and pick up the particles. The particles then located on the brush are greatly loosened in terms of their force of adhesion to the feathers by means of a neutralisation device 15 for electrostatic charges. The particles are then removed from the feathers at a knocking-off device 12 and sucked away. After brushing and before a further cleaning stage, the force of adhesion of the particles to the substrate can be reduced by means of a neutralisation device 16 for electrostatic charges.

During the subsequent cleaning stage, the remaining particles are removed from the substrate by the transfer roller 18 and handed over to the adhesive roller 19. A downstream neutralisation device 17 for electrostatic charges helps to avoid any reattachment of particles. Holding-down devices 22, 23, 24, such as e.g. wheels, which act on the substrate edge ensure a sufficient planarity of the substrate. After the last cleaning step, the plastic particles are melted in the furnace and then the resulting plastic layer together with the substrate is cooled in the cooling zone 26.

It should be clear that many of the elements shown in FIGS. 1 and 4 are optional. By way of example, it is also possible to provide only one cleaning device, e.g. only an adhesive roller. The ionisation devices and the edge suction are also optional. The guide for the substrate may also be configured differently from what is shown in FIG. 4. In addition, the metering of the plastic powder may take place using means other than the metering roller 10.

LIST OF REFERENCES 1 substrate to be coated, foil
2 plastic powder
3 dispensing device
4 loosening device
5 powder skimming device, scraper
6 brush
7 drive for the brush
8 screen-type device
9 drive for the screen-type device
10 roller
11 brush roller
12 knocking-off device
14, 15, 16, 17 ionisation device
18 transfer roller
19 adhesive roller
21 edge suction
22, 23, 24 holding-down device
25 furnace
26 cooling zone

The invention claimed is:

1. A method for producing a plastic layer having a layer thickness of less than 200 μm on an upper side of a copper foil substrate, the method comprising the following steps:
   applying a plastic powder to the upper side of the copper foil substrate by means of a powder scattering device, said plastic powder having a particle size distribution with a D50 value in a range from 10 to 100 μm,
   then cleaning the underside of the copper foil substrate to remove any plastic powder therefrom, wherein cleaning includes a first cleaning step using suction or a brush followed by a second cleaning step using an adhesive roller,
   then melting the applied plastic powder in a furnace, as a result of which the plastic layer is formed on the substrate, and cooling the substrate,
   wherein the substrate is transported continuously from method step to method step.

2. A method according to claim 1, wherein the powder scattering device comprises a metering roller, and wherein the plastic powder is metered via the metering roller.

3. A method according to claim 2, wherein the powder is brushed out from the metering roller and, from the brushing-out location, drops firstly onto at least one screen before it drops from there onto the substrate.

4. A method according to claim 3, wherein the distance of the screen lower edge from the substrate is less than 50 mm.

5. A method according to claim 1, wherein the D50 value of the plastic powder, which describes the particle size of the plastic particles to be applied, is set to a predetermined value range before the plastic powder is applied.

6. A method according to claim 1, wherein a motor drive drives the adhesive roller.

7. A method according to claim 1, wherein the first cleaning step is configured in such a way that it removes more than 80% of the plastic particles located on the underside of the copper substrate.

8. A method according to claim 1, wherein the first cleaning step takes place by means of a brush comprising bird feathers or plastic fibres.

9. A method according to claim 1, wherein the application takes place evenly, so that a plastic layer with a uniform layer thickness distribution is obtained.

10. A method according to claim 1, wherein heating elements in the furnace are arranged opposite the substrate on the side comprising the scattered powder.

11. A method according to claim 1, wherein the substrate is coated with plastic on one side, the coated substrate being adapted for use as a base material for producing printed circuit boards or conductor foils.

12. A method according to claim 1, wherein the substrate is coated with plastic on one side.

13. An apparatus for producing a plastic layer having a layer thickness of less than 200 μm on an upper side of a copper foil substrate, the apparatus comprising:
   a powder scattering device for applying plastic powder having a particle size distribution with a D50 value in a range from 10 to 100 μm to the upper side of the copper foil substrate,
   a cleaning device for cleaning the underside of the copper foil substrate prior to melting the plastic powder, wherein the cleaning device is configured to first clean using suction or a brush followed by cleaning using an adhesive roller,
   a furnace for melting the plastic powder applied to the substrate,
   a cooling zone, and
   a transport device which transports the substrate continuously through the apparatus,
   the cleaning device being provided downstream of the powder scattering device and upstream of the furnace.

14. An apparatus according to claim 13, wherein the powder scattering device comprises a metering roller for metering the plastic powder.

15. An apparatus according to claim 14, wherein the powder scattering device comprises a brush for brushing the plastic powder out of the metering roller.

16. An apparatus according to claim 15, wherein at least one screen is arranged between a location at which the plastic powder is brushed out and the substrate.

17. An apparatus according to claim 13, wherein the powder scattering device comprises at least one storage container, a metering device and a distributor device.

18. An apparatus according to claim 13, wherein the powder scattering device comprises a distributor device, wherein the distance between a lower edge of the distributor device and the substrate is less than 100 mm.

19. An apparatus according to claim 13, wherein the cleaning device comprises a drive for driving the adhesive roller.

20. An apparatus according to claim 19, wherein the cleaning device comprises a suction device or brush arranged upstream of the adhesive roller.

21. An apparatus according to claim 20, wherein the brush comprises bird feathers or plastic fibres as cleaning elements.

22. An apparatus according to claim 13, wherein heating elements in the furnace are arranged opposite the substrate on the side comprising the scattered powder.

* * * * *